(12) United States Patent
Ko et al.

(10) Patent No.: US 11,444,058 B2
(45) Date of Patent: Sep. 13, 2022

(54) PACKAGE STRUCTURE WITH SEPARATED STREET BETWEEN CHIPS

(71) Applicant: NOVATEK Microelectronics Corp., Hsinchu (TW)

(72) Inventors: Chien-Chen Ko, Hsinchu (TW); Teng-Jui Yu, Hsinchu (TW); Wei-Kang Tsai, Hsinchu (TW)

(73) Assignee: NOVATEK Microelectronics Corp., Hsinchu (TW)

(*) Notice: Subject to any disclaimer, the term of this patent is extended or adjusted under 35 U.S.C. 154(b) by 5 days.

(21) Appl. No.: 17/152,806

(22) Filed: Jan. 20, 2021

(65) Prior Publication Data

US 2022/0149006 A1 May 12, 2022

Related U.S. Application Data

(60) Provisional application No. 63/110,377, filed on Nov. 6, 2020.

(51) Int. Cl.
*H01L 25/065* (2006.01)
*H01L 23/528* (2006.01)
*H01L 23/544* (2006.01)

(52) U.S. Cl.
CPC ...... *H01L 25/0655* (2013.01); *H01L 23/5286* (2013.01); *H01L 23/544* (2013.01)

(58) Field of Classification Search
CPC  H01L 25/0655; H01L 23/5286; H01L 23/544
USPC .................................................. 257/620, 776
See application file for complete search history.

(56) References Cited

U.S. PATENT DOCUMENTS

| 10,692,837 | B1 | 6/2020 | Kim et al. |
| 11,270,948 | B2* | 3/2022 | Blank ................. H01L 29/7811 |
| 2010/0019397 | A1* | 1/2010 | Youn ................... H01L 23/5286 257/784 |
| 2010/0072605 | A1 | 3/2010 | Gamini et al. |

* cited by examiner

*Primary Examiner* — Quoc D Hoang
(74) *Attorney, Agent, or Firm* — CKC & Partners Co., LLC

(57) ABSTRACT

A package structure includes a first chip and a second chip. The first chip is connected to a pair of first signal lines and a plurality of first power lines. The second chip is connected to a pair of second signal lines and a plurality of second power lines. The first chip and the second chip belong to a common wafer. A separated street is between the first chip and the second chip.

17 Claims, 3 Drawing Sheets

PACKAGE STRUCTURE WITH SEPARATED STREET BETWEEN CHIPS

RELATED APPLICATIONS

This application claims priority to U.S. Provisional Application Ser. No. 63/110,377, filed Nov. 6, 2020, which is herein incorporated by reference.

BACKGROUND

Technical Field

The present disclosure relates to package technology. More particularly, the present disclosure relates to a package structure.

Description of Related Art

With development of technology, integrated circuits (ICs) have been applied to various fields, and various packaging methods also have been developed.

In some related arts, one or more individual chips are packaged into one package structure. For example, one or more chips belong to different wafers and are attached on a flexible print circuit board such that they are packaged into one package structure. Since these chips belong to the different wafers, two adjacent chips in the package structure are separated by a longer distance (for example, 6 mm to 10 mm) based on the packaging rule. In this situation, the size of the package structure is larger.

SUMMARY

Some aspects of the present disclosure are to provide a package structure. The package structure includes a first chip and a second chip. The first chip is connected to a pair of first signal lines and a plurality of first power lines. The second chip is connected to a pair of second signal lines and a plurality of second power lines. The first chip and the second chip belong to a common wafer. A separated street is between the first chip and the second chip.

BRIEF DESCRIPTION OF THE DRAWINGS

The disclosure can be more fully understood by reading the following detailed description of the embodiment, with reference made to the accompanying drawings as follows.

DETAILED DESCRIPTION

The embodiments in the following descriptions are described in detail with the accompanying drawings, but the examples provided are not intended to limit the scope of the disclosure covered by the present disclosure. The structure and operation are not intended to limit the execution order. Any structure regrouped by elements, which has an equal effect, is covered by the scope of the present disclosure. In addition, the drawings are merely for illustration and are not illustrated according original sizes. For ease of understanding, the same or similar components in the following descriptions will be described with the same symbols.

It will be understood that, although the terms first, second, third etc. may be used in the present disclosure to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present disclosure.

Figure 1:
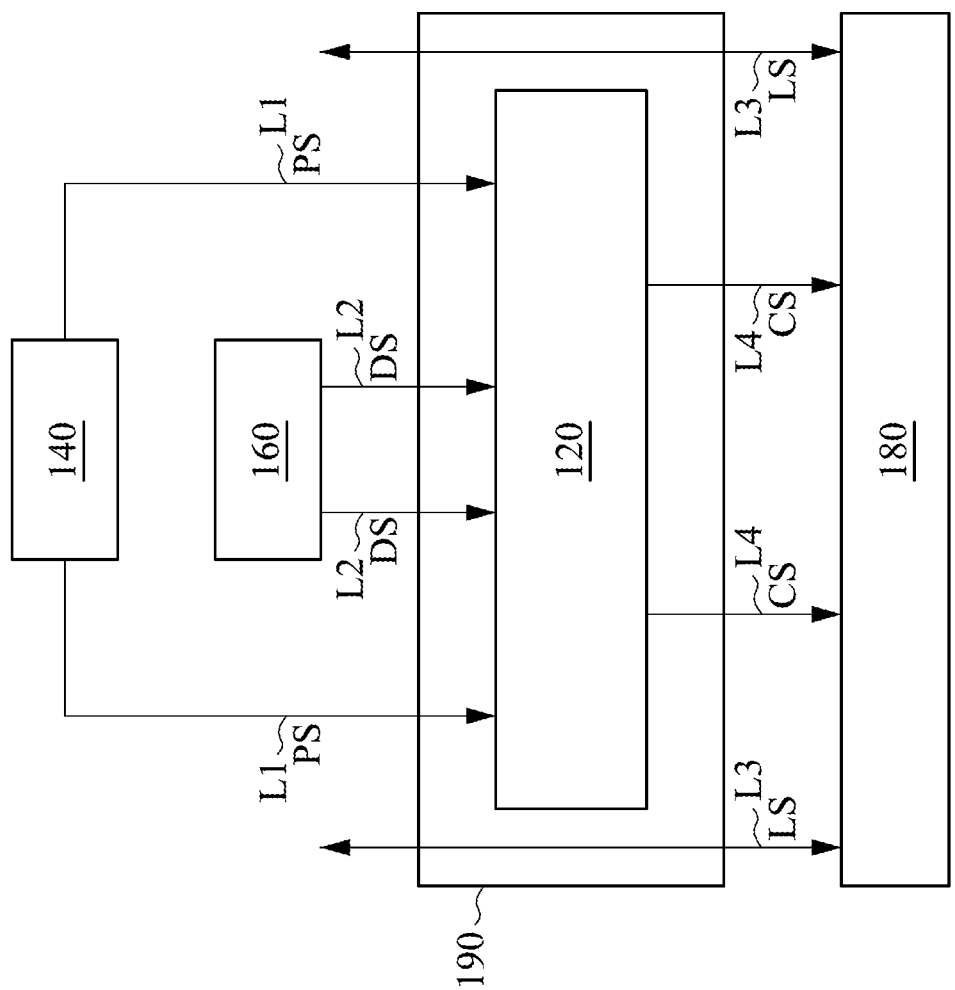
FIG. 1 is a schematic diagram illustrating an electrical system according to some embodiments of the present disclosure.

Reference is made to FIG. 1. FIG. 1 is a schematic diagram illustrating an electrical system 100 according to some embodiments of the present disclosure. In some embodiments, the electrical system 100 is a display device and is configured for displaying an image.

The implementation of the electrical system 100 above is merely for illustration, and the present disclosure is not limited thereto. Various implementations of the electrical system 100 are within the contemplated scopes of the present disclosure. For example, the electrical system 100 may be an electrical system with other functions.

As illustrated in FIG. 1, the electrical system 100 includes a driver integrated circuit (IC) 120, a power IC 140, a timing controller 160, and a display panel 180. The diver IC 120 is attached on a flexible print circuit board 190.

The power IC 140 is coupled to the diver IC 120 and configured to provide power to the diver IC 120. In some embodiments, the power IC 140 includes a plurality of power sources to provide different power voltages to the diver IC 120, in order to power on the diver IC 120.

The timing controller 160 is coupled to the diver IC 120 and configured to control the diver IC 120. In some embodiments, the timing controller 160 includes a plurality of signal sources to provide different control signals or display data to the diver IC 120, in order to control the diver IC 120.

The diver IC 120 is coupled to the display panel 180 and configured to drive the display panel 180. In some embodiments, the driver IC 120 includes a plurality of driver chips to provide different driving signals or display data to the display panel 180, in order to drive the display panel 180 to display the image. For example, the driver IC 120 may be a source driver, a gate driver, or a combination thereof.

In the present disclosure, "connected" or "coupled" may refer to "electrically connected" or "electrically coupled." "Connected" or "coupled" may also refer to operations or actions between two or more elements.

In some embodiments, the electrical system 100 further includes a plurality of power lines L1, a plurality of signal lines L2, a plurality of pass lines L3, and a plurality of chip lines L4. The power lines L1, the signal lines L2, the pass lines L3, and the chip lines L4 may be made by conductive segments.

As illustrated in FIG. 1, the power lines L1 are coupled between the power IC 140 and the diver IC 120. These power lines L1 are configured to transmit power signals PS from the power source(s) in the power IC 140 to the diver IC 120. Thus, the diver IC 120 can be powered on according to the received power signals PS.

The signal lines L2 are coupled between the timing controller 160 and the diver IC 120. The signal lines L2 are configured to transmit differential signals DS from the signal source(s) in the timing controller 160 to the diver IC 120. As described above, the differential signals DS may be the control signals or the display data. Thus, the diver IC 120 can be controlled to operate according to the received differential signals DS.

The pass lines L3 are arranged on the flexible print circuit board 190 and are coupled between the display panel 180 and other circuits. The pass lines L3 are configured to transmit pass line signals LS between the display panel 180 and these circuits without passing through the diver IC 120. The pass line signals LS may be other signals.

The chip lines L4 are coupled between the diver IC 120 and the display panel 180. The chip lines L4 are configured to transmit chip signals CS from the diver IC 120 to the display panel 180. As described above, the chip signals CS may be the driving signals or the display data. Thus, the display panel 180 can be driven to display the image according to the received chip signals CS.

It is noted that the quantities of the power lines L1, the signal lines L2, the pass lines L3, and the chip lines L4 in FIG. 1 are merely for illustration, and the present disclosure is not limited thereto. Various quantities of the power lines L1, the signal lines L2, the pass lines L3, and the chip lines L4 are within the contemplated scopes of the present disclosure.

Figure 2:
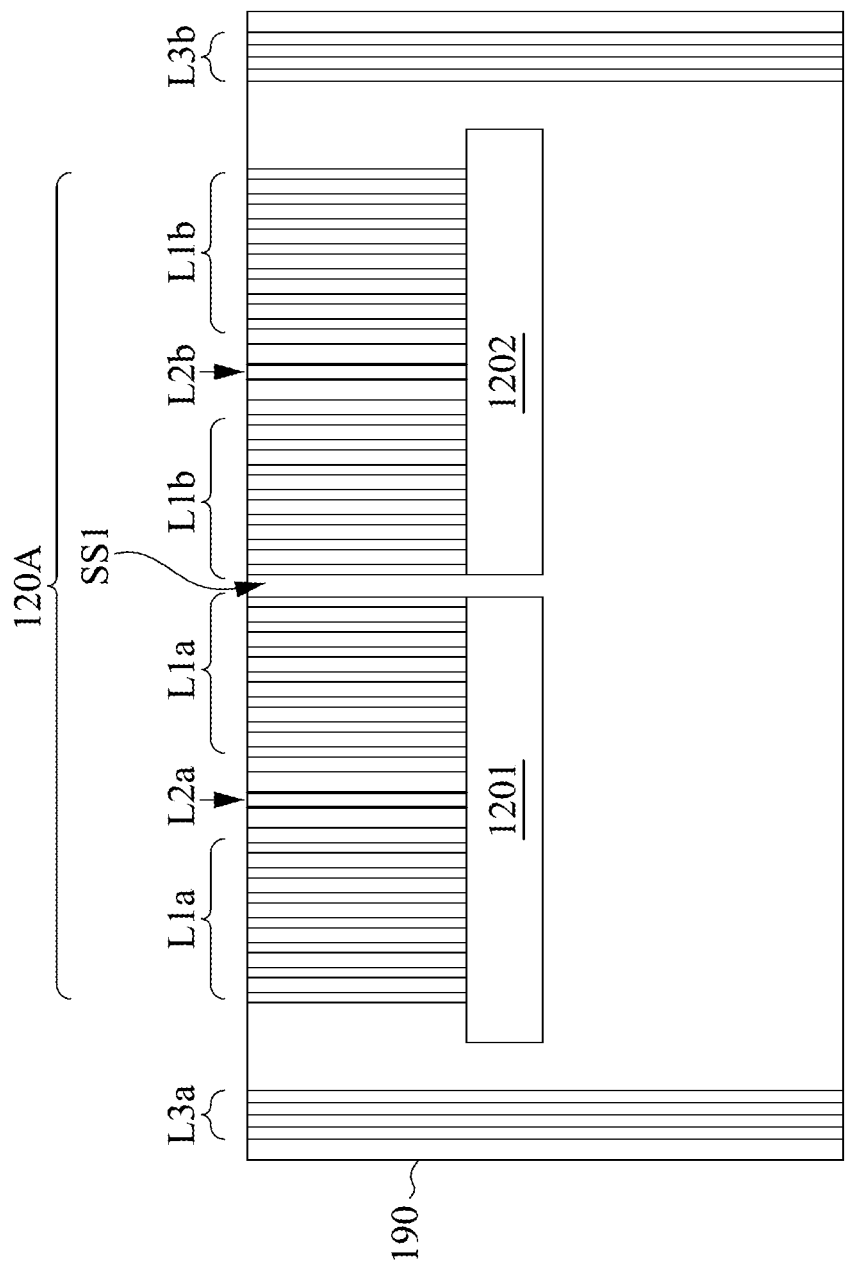
FIG. 2 is a schematic diagram illustrating an integrated circuit on a flexible print circuit board according to some embodiments of the present disclosure.

Reference is made to FIG. 2. FIG. 2 is a schematic diagram illustrating an IC on the flexible print circuit 190 board according to some embodiments of the present disclosure. As illustrated in FIG. 2, the IC on the flexible print circuit 190 is a driver IC 120A, and the driver IC 120A may be an example of the driver IC 120 in FIG. 1.

In some embodiments, the driver IC 120A includes multiple chips that belong to a common wafer. As illustrated in FIG. 2, the driver IC 120A includes a first chip 1201 and a second chip 1202, and the first chip 1201 and the second chip 1202 belong to the common wafer.

It is noted that the quantity of the chips in the driver IC 120A is merely for illustration, and the present disclosure is not limited thereto. Various quantities of the chips are within the contemplated scopes of the present disclosure.

The first chip 1201 is coupled to a plurality of first power lines L1$a$ and a pair of first signal lines L2$a$. The first power lines L1$a$ are disposed at two sides of the pair of first signal lines L2$a$. To be more specific, the pair of first signal lines L2$a$ are disposed at the center of the first chip 1201, some of the first power lines L1$a$ are disposed at the right side of the pair of first signal lines L2$a$, and other are disposed at the left side of the pair of first signal lines L2$a$. Similarly, the second chip 1202 is coupled to a plurality of second power lines L1$b$ and a pair of second signal lines L2$b$. The second power lines L1$b$ are disposed at two sides of the pair of second signal lines L2$b$. To be more specific, the pair of second signal lines L2$b$ are disposed at the center of the second chip 1202, some of the second power lines L1$b$ are disposed at the right side of the pair of first signal lines L2$b$, and other are disposed at the left side of the pair of first signal lines L2$b$. Effectively, some of the first power lines L1$a$ and some of the second power lines L1$b$ are disposed in a space between the pair of first signal lines L2$a$ and the pair of second signal lines L2$b$.

In addition, a plurality of pass lines L3$a$ and L3$b$ are disposed at two sides of the first chip 1201 and the second chip 1202. To be more specific, the pass lines L3$a$ are at the left side of the first chip 1201 and the pass lines L3$b$ are disposed at the right side of the second chip 1202. Explained in another way, the first chip 1201, the second chip 1202, the first power lines L1$a$, the second power lines L1$b$, the pair of first signal lines L2$a$, and the pair of second signal lines L2$b$ are disposed in a space between the pass lines L3$a$ and the pass lines L3$b$. The pass lines L3$a$ and L3$b$ are configured to transmit the pass line signals LS in FIG. 1 without passing through the first chip 1201 and the second chip 1202.

In some embodiments, the first chip 1201 and the second chip 1202 perform the same function. For example, both of the first chip 1201 and the second chip 1202 are source drivers and they are used to drive a display panel that has a larger size. In these embodiments, the channel number of the diver IC 120A can be increased (for example, doubled).

In some other embodiments, the first chip 1201 and the second chip 1202 perform different functions. In these other embodiments, the diver IC 120A can perform multiple functions and can be applied to more fields.

As described above, the first chip 1201 and the second chip 1202 belong to the common wafer. In other words, the first chip 1201 and the second chip 1202 belong to the same wafer. As illustrated in FIG. 2, the first chip 1201 and the second chip 1202 can be packaged into one package structure, and a separated street SS1 is between the first chip 1201 and the second chip 1202. In some embodiments, the separated street SS1 is also referred as a scribing line. In general, when chips are designed on a wafer, the wafer will be divided into a plurality of regions by the scribing lines and the chips are arranged on the regions respectively. Then, a cutter is used to cut the regions along the scribing lines in order to form individual chips.

As illustrated in FIG. 2, the separated street SS1 can be used for separating the first chip 1201 and the second chip 1202, and the separated street SS1 is disposed between one of the first power lines L1$a$ and one of the second power lines L1B. To be more specific, the separated street SS1 is disposed between the rightmost first power lines L1$a$ coupled to the first chip 1201 and the leftmost second power lines L1$b$ coupled to the second chip 1202.

However, in the present disclosure, the separated street SS1 is not cut, and the first chip 1201 and the second chip 1202 are packaged into one package structure. For example, the first chip 1201 and the second chip 1202 can be packaged into a Chip-on-Film (CoF) package. Thus, the separated street SS1 is a scribing line inside the package or a scribing line inside the driver IC 120A.

In some embodiments, the separated street SS1 is a blank area or an invalid circuit area. Explained in another way, with the configuration of the separated street SS1, the first chip 1201 is dependent from the second chip 1202, or the first chip 1201 is electrically disconnected to the second chip 1202. In this situation, the first chip 1201 would not affect operations of the second chip 1202, and the second chip 1202 would not affect operations of the first chip 1201.

In some related arts, one or more individual chips are packaged into one package structure. For example, one or more chips belong to different wafers and are attached on a flexible print circuit board such that they are packaged into one package structure. Since these chips belong to the different wafers, two adjacent chips in the package structure are separated by a longer distance (for example, 6 mm to 10 mm) based on the packaging rule. In this situation, the size of the package structure is larger.

Compared to these related arts, in the present disclosure, the separated street SS1 between the first chip 1201 and the second chip 1202 that belong to the common wafer is not cut, and the first chip 1201 and the second chip 1202 are packaged into one package. Therefore, the size of the package can be reduced since the first chip 1201 and the second chip 1202 that belong to the common wafer are separated by a shorter distance. In some embodiments, a width of the separated street SS1 is less than aforementioned 6 mm. In other words, the first chip 1201 and the second chip 1202 are separated by less than 6 mm. For example, the width of the separated street SS1 can be substantially in a range of 70 µm to 90 µm. In addition, with this configuration, the design of the power plane and the design of circuits can be easier, and the driver IC 120A can share masks with products with a single IC.

Figure 3:
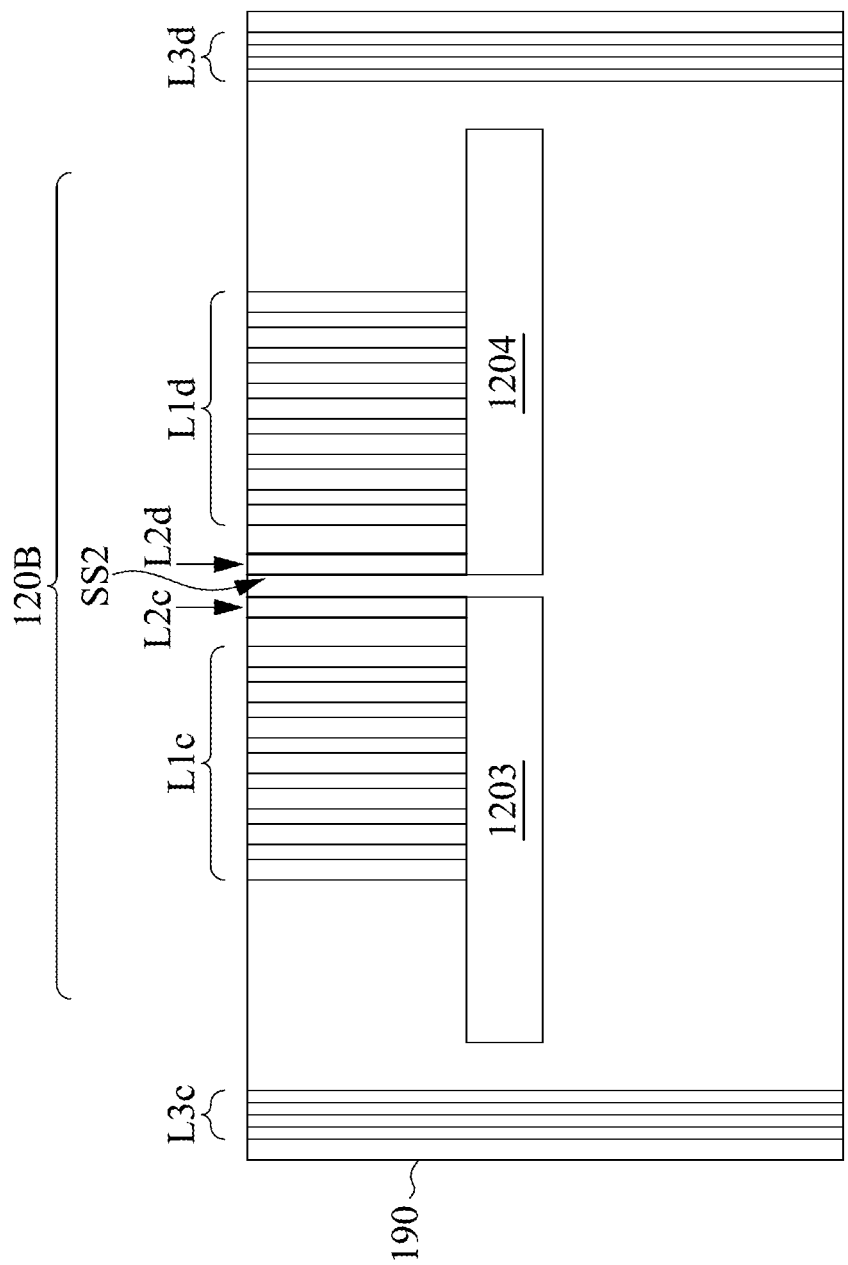
FIG. 3 is a schematic diagram illustrating an integrated circuit on a flexible print circuit board according to some embodiments of the present disclosure.

Reference is made to FIG. 3. FIG. 3 is a schematic diagram illustrating an IC on the flexible print circuit board 190 according to some embodiments of the present disclosure. As illustrated in FIG. 3, the IC on the flexible print circuit 190 is a driver IC 120B, and the driver IC 120B may be an example of the driver IC 120 in FIG. 1.

Similar to the driver IC 120A in FIG. 2, the driver IC 120B in FIG. 3 includes multiple chips that belong to a common wafer. As illustrated in FIG. 3, the driver IC 120B includes a first chip 1203 and a second chip 1204, and the first chip 1203 and the second chip 1204 belong to the common wafer.

It is noted that the quantity of the chips in the driver IC 120B is merely for illustration, and the present disclosure is not limited thereto. Various quantities of the chips are within the contemplated scopes of the present disclosure.

The first chip 1203 is coupled to a plurality of first power lines L1c and a pair of first signal lines L2c. The pair of first signal lines L2c are disposed at the edge of the first chip 1203, and the first power lines L1c are disposed at a side (for example, the left side) of the first signal line L2c. The second chip 1204 is coupled to a plurality of second power lines L1d and a pair of second signal lines L2d. The pair of second signal lines L2d are disposed at the edge of the second chip 1204, and the second power lines L1d are disposed at a side (for example, the right side) of the second signal lines L2d. The pair of first signals line L2c are adjacent to the pair of second signal lines L2d, and the pair of first signals line L2c and the pair of second signal lines L2d are disposed in a space between the first power lines L1c and the second power lines L1d.

In addition, a plurality of pass lines L3c and L3d are disposed at two sides of the first chip 1203 and the second chip 1204. The configuration and operations of the pass lines L3c and L3d in FIG. 3 are similar to the pass lines L3a and L3b in FIG. 2, so they are not described herein again.

Similarly, the first chip 1203 and the second chip 1204 can perform the same function or perform different functions. Thus, the channel number of the diver IC 120B can be increased (for example, doubled) or the diver IC 120B can perform multiple functions.

As described above, the first chip 1203 and the second chip 1204 belong to the common wafer. In other words, the first chip 1203 and the second chip 1204 belong to the same wafer. As illustrated in FIG. 3, the first chip 1203 and the second chip 1204 are packaged into one package structure, and a separated street SS2 is between the first chip 1203 and the second chip 1204.

As illustrated in FIG. 3, the separated street SS2 can be used for separating the first chip 1203 and the second chip 1204, and the separated street SS2 is disposed between one of the pair of the first signal lines L2c and one of the pair of the second signal lines L2d.

In the present disclosure, the separated street SS2 is not cut, and the first chip 1203 and the second chip 1204 are packaged into one package structure. For example, the first chip 1203 and the second chip 1204 can be packaged into a Chip-on-Film (CoF) package. Thus, the separated street SS2 is a scribing line inside the package or a scribing line inside the driver IC 120B.

The functions of the separated street SS2 in FIG. 3 are similar to those of the separated street SS1 in FIG. 2, so they are not described herein again.

Based on the descriptions above, in the present disclosure, the separated street between the first chip and the second chip that belong to the common wafer is not cut, and the first chip and the second chip are packaged into one package structure. Therefore, the size of the package can be reduced since the first chip and the second chip that belong to the common wafer are separated by a shorter distance.

Various functional components or blocks have been described herein. As will be appreciated by persons skilled in the art, in some embodiments, the functional blocks will preferably be implemented through circuits (either dedicated circuits, or general purpose circuits, which operate under the control of one or more processors and coded instructions), which will typically comprise transistors or other circuit elements that are configured in such a way as to control the operation of the circuity in accordance with the functions and operations described herein. As will be further appreciated, the specific structure or interconnections of the circuit elements will typically be determined by a compiler, such as a register transfer language (RTL) compiler. RTL compilers operate upon scripts that closely resemble assembly language code, to compile the script into a form that is used for the layout or fabrication of the ultimate circuitry.

Although the present disclosure has been described in considerable detail with reference to certain embodiments thereof, other embodiments are possible. Therefore, the spirit and scope of the appended claims should not be limited to the description of the embodiments contained herein. It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A package structure, comprising:
   a first chip connected to a pair of first signal lines and a plurality of first power lines; and
   a second chip connected to a pair of second signal lines and a plurality of second power lines,
   wherein the first chip and the second chip belong to a common wafer, and a separated street is between the first chip and the second chip,
   wherein the pair of first signal lines and the plurality of first power lines, the pair of second signal lines and the plurality of second power lines are disposed between a plurality of first pass lines and a plurality of second pass lines.

2. The package structure of claim 1, wherein the first chip and the second chip perform the same function.

3. The package structure of claim 1, wherein the first chip and the second chip perform different functions.

4. The package structure of claim 1, wherein the first power lines are disposed at two sides of the pair of first signal lines.

5. The package structure of claim 1, wherein the second power lines are disposed at two sides of the pair of second signal lines.

6. The package structure of claim 5, wherein the separated street is between one of the first power lines and one of the second power lines.

7. The package structure of claim 1, wherein the pair of first signal lines are adjacent to the pair of second signal lines.

8. The package structure of claim 7, wherein the pair of first signal lines and the pair of second signal lines are disposed between the first power lines and the second power lines.

9. The package structure of claim 7, wherein the separated street is between one of the pair of first signal lines and one of the pair of second signal lines.

10. The package structure of claim 1, wherein separated street is an invalid circuit area.

11. The package structure of claim 1, wherein the first chip is dependent from the second chip.

12. The package structure of claim 11, wherein the first chip is electrically disconnected to the second chip.

13. The package structure of claim 1, wherein a width of the separated street is less than 6 mm.

14. The package structure of claim 13, wherein the width of the separated street is substantially in a range of 70 μm to 90 μm.

15. The package structure of claim 1, wherein the plurality of first pass lines are disposed at a side of the first chip, and the plurality of second pass lines are disposed at a side of the second chip, wherein the plurality of first pass lines and the plurality of second pass lines are configured to transmit signals without passing through the first chip and the second chip.

16. The package structure of claim 1, wherein the pair of first signal lines or the pair of second signal lines are configured to receive differential signals from a timing controller of a display device, and the first power lines or the second power lines are configured to receive power signals from a power IC of the display device.

17. The package structure of claim 1, wherein the second chip and the first chip are in a Chip-on-Film package.

* * * * *